(12) United States Patent
Yang et al.

(10) Patent No.: US 11,483,541 B1
(45) Date of Patent: Oct. 25, 2022

(54) STEREOSCOPIC IMAGE DISPLAY DEVICE CAPABLE OF REDUCING GRID VISUAL EFFECT

(71) Applicant: Lixel Inc., Taipei (TW)

(72) Inventors: Chun-Hsiang Yang, Hsinchu (TW);
Chih-Hung Ting, New Taipei (TW);
Kai-Chieh Chang, Kaohsiung (TW);
Hsin-You Hou, New Taipei (TW);
Wei-An Chen, Hsinchu County (TW);
Kuan-Yu Chen, Taichung (TW);
Chih-Wei Shih, Hsinchu (TW)

(73) Assignee: Lixel Inc., Taipei (TW)

( * ) Notice: Subject to any disclaimer, the term of this patent is extended or adjusted under 35 U.S.C. 154(b) by 0 days.

(21) Appl. No.: 17/404,993

(22) Filed: Aug. 17, 2021

(30) Foreign Application Priority Data

May 5, 2021 (TW) .................................. 110116175

(51) Int. Cl.
*H04N 13/307* (2018.01)
*H01L 27/32* (2006.01)

(52) U.S. Cl.
CPC ....... *H04N 13/307* (2018.05); *H01L 27/3232* (2013.01)

(58) Field of Classification Search
USPC ........................................................ 348/51
See application file for complete search history.

(56) References Cited

U.S. PATENT DOCUMENTS

| 2015/0249820 | A1* | 9/2015 | Saigo | H04N 13/305 |
| | | | | 348/55 |
| 2018/0239159 | A1 | 8/2018 | Jung et al. | |
| 2021/0227196 | A1* | 7/2021 | Niu | G02B 30/27 |
| 2021/0318552 | A1* | 10/2021 | Yang | G02B 30/32 |

FOREIGN PATENT DOCUMENTS

| CN | 1174276 C | * | 11/2004 | ........... G02B 6/0046 |
| CN | 112987330 A | * | 6/2021 | ............. G02B 30/27 |
| CN | 114185232 A | * | 3/2022 | ............... G03B 21/00 |
| TW | 200823858 A | * | 6/2008 | ............... G09G 5/00 |

* cited by examiner

*Primary Examiner* — Behrooz M Senfi
(74) *Attorney, Agent, or Firm* — Li & Cai Intellectual Property Office (57) ABSTRACT

A stereoscopic image display device capable of reducing grid visual effect includes a flat display unit, a light source unit disposed on a side of the flat display unit, and a lens array unit disposed on another side of the flat display unit. A light source provided by the light source unit satisfies an optical characteristic as follows: an attenuation amplitude of a luminance of the light source before entering the lens array unit being not greater than 65% within a divergence angle of a light field system of the stereoscopic image display device, thereby reducing the grid visual effect of a stereo image generated by the stereoscopic image display device.

10 Claims, 7 Drawing Sheets

STEREOSCOPIC IMAGE DISPLAY DEVICE CAPABLE OF REDUCING GRID VISUAL EFFECT

CROSS-REFERENCE TO RELATED PATENT APPLICATION

This application claims the benefit of priority to Taiwan Patent Application No. 110116175, filed on May 5, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a stereoscopic image display device, and more particularly to a stereoscopic image display device capable of reducing grid visual effect.

BACKGROUND OF THE DISCLOSURE

Figure 1:
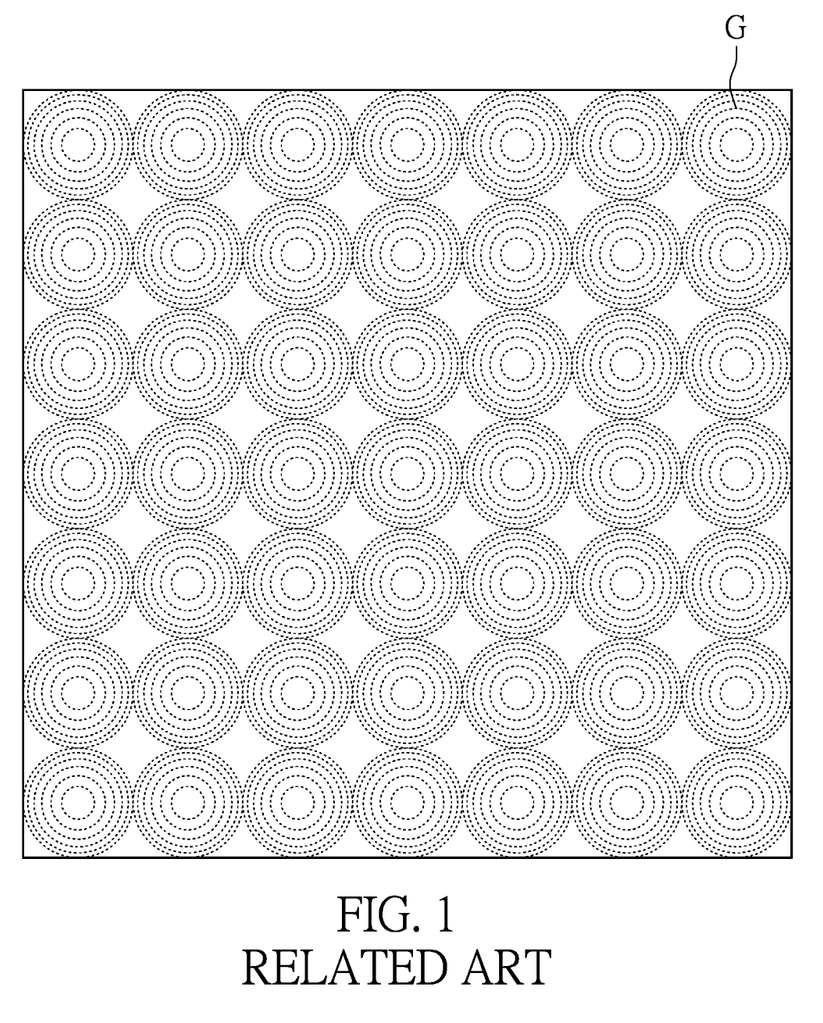
FIG. 1 is a schematic view showing a conventional stereo image with a grid visual effect.

In a conventional stereoscopic image display device, since a center intensity of a lens of a light field system is greater than an edge intensity of the lens, a grid-like visual effect with light and dark contrast can be observed by a viewer when viewing a stereo image as shown in FIG. 1.

SUMMARY OF THE DISCLOSURE

In response to the above-referenced technical inadequacies, the present disclosure provides a stereoscopic image display device capable of reducing grid visual effect.

In one aspect, the present disclosure provides a stereoscopic image display device capable of reducing grid visual effect. The stereoscopic image display device includes a flat display unit, a light source unit, and a lens array unit. The flat display unit has a display surface, and the display surface is configured to display an integrated image. The light source unit is disposed on a side of the flat display unit, and the light source unit is configured to provide a light source to pass through the flat display unit to provide light required for the display surface to display the integrated image. The lens array unit is disposed on another side of the flat display unit. After the light source provided by the light source unit passes through the flat display unit, the light source is capable of passing through the lens array unit, so that the light of the integrated image is capable being reconstructed into a stereo image. The light source provided by the light source unit satisfies an optical characteristic as follows: an attenuation amplitude of a luminance of the light source before entering the lens array unit being not greater than 65% within a divergence angle of a light field system of the stereoscopic image display device, thereby reducing the grid visual effect of the stereo image generated by the stereoscopic image display device.

Preferably, the divergence angle of the light field system is defined by a formula of:

$$\sin^{-1}(n\_Lens * \sin(90 - alpha - beta)).$$

The parameters in the formula are explained as follows:

$$alpha = \tan^{-1}((R - Lens_{seq})/(P/2));$$

$$beta = \sin^{-1}\left(\frac{\sin(90 - alpha - \tan^{-1}(R_{slope}))}{n_{Lens}}\right);$$

$$Lens_{seq} = R - \sqrt{R^2 - (P/2)^2}; \text{ and}$$

$$R\_slope = \frac{\sqrt{\left(\frac{L}{2} + WD * \tan\left(\frac{VA}{2}\right)\right)^2 + \left(\frac{W}{2}\right)^2}}{WD};$$

in which n_Lens is a refractive index of a lens in the lens array unit; R is a radius of curvature of the lens in the lens array unit; P is a distance between two adjacent lenses in the lens array unit; L is a length of the flat display unit; W is a width of the flat display unit; WD is a working distance of the light field system; and VA is a viewing angle of a viewer.

Preferably, alpha is an angle of the light source after being emitted from an edge of the lens of the lens array unit; beta is an angle of the light source before being emitted from the edge of the lens of the lens array unit; $Lens_{seq}$ is a height of a convex surface of the lens of the lens array unit; and R_slope is a slope defined by a sight of the viewer relative to a corner of the flat display unit.

Preferably, the attenuation amplitude of the luminance of the light source provided by the light source unit before entering the lens array unit is not greater than 50% within the divergence angle of the light field system of the stereoscopic image display device.

Preferably, the divergence angle of the light field system is positively correlated with an absolute value of the viewing angle of the viewer.

Preferably, the divergence angle of the light field system is positively correlated with the length and the width of the flat display unit.

Preferably, the light source unit is a backlight unit with a divergent property, and the light source provided by the backlight unit still satisfies the optical characteristic after passing through the flat display unit.

Preferably, the stereoscopic image display device further includes a dielectric coating film that is disposed between the display surface and the lens array unit. A luminance uniformity of the light source is adjusted to meet the optical characteristic after passing through the dielectric coating film.

Preferably, within the divergence angle of the light field system, the dielectric coating film has a first light transmittance with respect to a first incident angle of the light source, and the dielectric coating film has a second light transmittance with respect to a second incident angle of the light source. If an absolute value of the first incident angle is less than an absolute value of the second incident angle, the first light transmittance is less than the second light transmittance.

Preferably, the light source unit is a backlight unit with a divergent property, and the stereoscopic image display device further includes a dielectric coating film that is disposed between the display surface of the flat display unit and the lens array unit, so that the light source provided by the light source unit satisfies the optical characteristic.

Preferably, the light source unit is further defined as a self-luminous light source of an organic light emitting diode display (OLED display), and the display surface of the flat display unit is further defined as display pixels of the organic light emitting diode display.

Therefore, by virtue of "the light source provided by the light source unit satisfies an optical characteristic as follows: an attenuation amplitude of a luminance of the light source before entering the lens array unit being not greater than 65% within a divergence angle of a light field system of the stereoscopic image display device", the stereoscopic image display device of the present disclosure can effectively reduce the grid visual effect of the stereo image, and effectively enhance the display quality of the stereo image.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Stereoscopic Image Display Device

Figure 2:
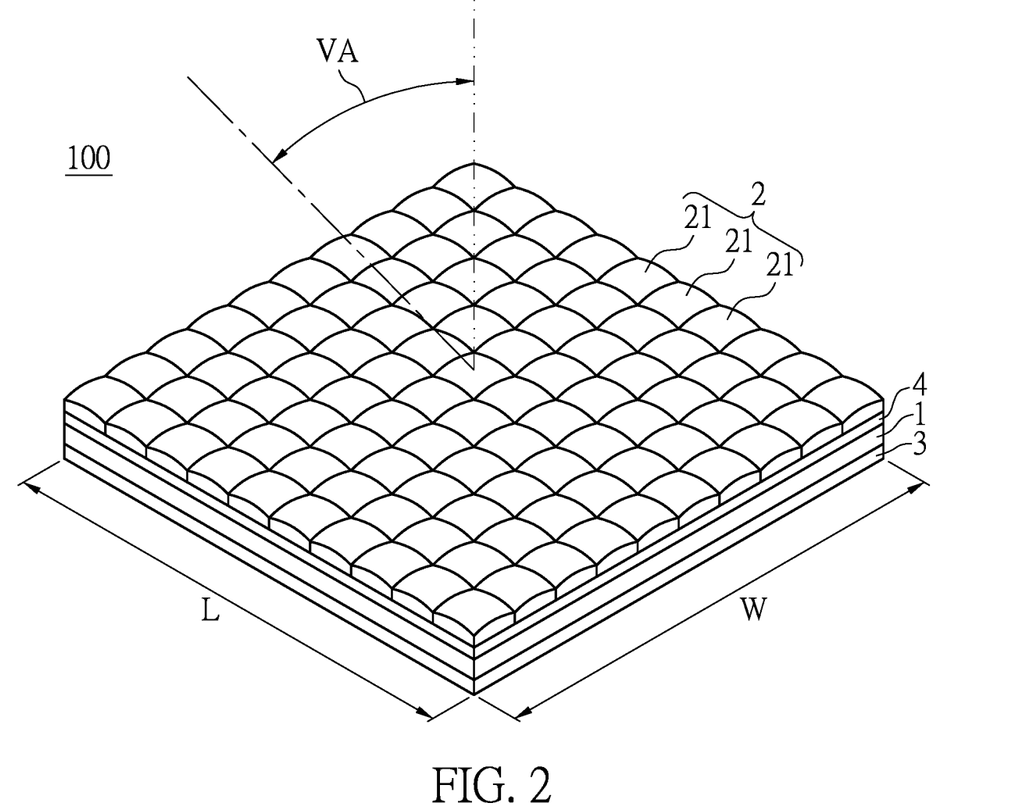
FIG. 2 is a perspective view showing a stereoscopic image display device according to one embodiment of the present disclosure.
Figure 3:
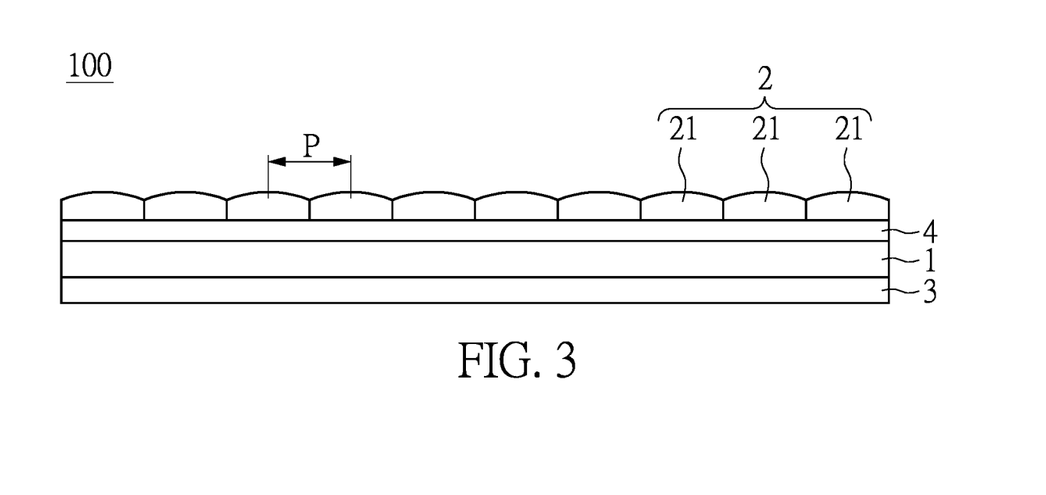
FIG. 3 is a side view showing the stereoscopic image display device according to one embodiment of the present disclosure.

Referring to FIG. 2 and FIG. 3, an embodiment of the present disclosure provides a stereoscopic image display device 100. The stereoscopic image display device 100 can be applied to application fields such as optoelectronic, medical treatment, military, exhibition, display, education, entertainment, and consumer electronics. The stereoscopic image display device 100 may be, for example, an active floating 3D image display device, which can display a stereo image in a space above the stereoscopic image display device 100. In addition, the stereoscopic image display device 100 can be installed on any suitable installation position such as a desktop, a floor, or a ceiling when in use.

More specifically, an objective of the embodiment of the present disclosure is to provide a stereoscopic image display device 100 capable of reducing grid visual effect, so that a stereo image generated by the stereoscopic image display device 100 can have good image quality in operation.

In order to achieve the above objective, the stereoscopic image display device 100 provided by the embodiment of the present disclosure includes a flat panel display unit 1, a lens array unit 2, and a light source unit 3.

The flat panel display unit 1 has a display surface 11 (also referred to as display pixels), and the display surface 11 is configured to display an integrated image to provide an image source required by the stereoscopic image display device 100 to generate a stereo image (3D image).

The light source unit 3 is disposed on a side of the flat panel display unit 1. More specifically, the light source unit 3 is disposed on the side of the flat panel display unit 1 that is opposite to (or away from) the display surface 11. The light source unit 3 is configured to provide a light source 31 that can pass through the flat panel display unit 1 so as to provide light required by the display surface 11 to display the integrated image.

The lens array unit 2 is disposed on another side of the flat panel display unit 1. More specifically, the lens array unit 2 is disposed on the side of the flat panel display unit 1 that is the same as (or adjacent to) the display surface 11 and is spaced apart from the flat panel display unit 1, but the present disclosure is not limited thereto.

In an embodiment of the present disclosure, the stereoscopic image display device 100 further includes a spacer unit 4 that is disposed between the lens array unit 2 and the flat panel display unit 1, so that the lens array unit 2 and the flat panel display unit 1 are arranged at intervals through the spacer unit 4, but the present disclosure is not limited thereto.

Figure 4:
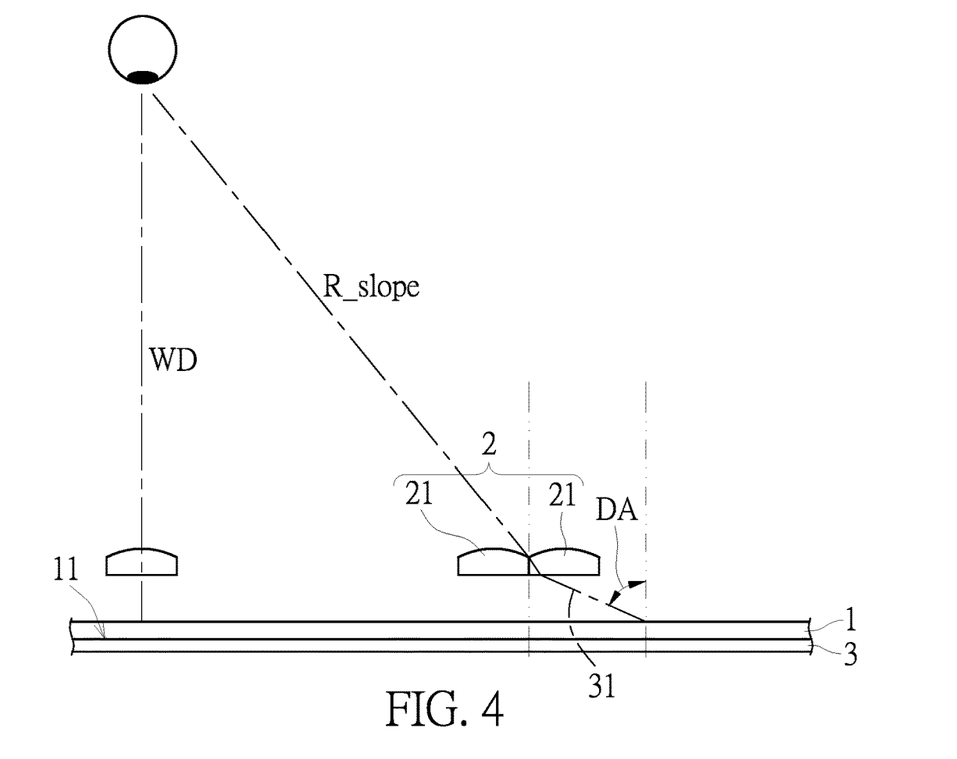
FIG. 4 is a schematic view showing a light field system of the stereoscopic image display device according to one embodiment of the present disclosure.

When the stereoscopic image display device 100 is operated, the display surface 11 of the flat panel display unit 1 is configured to receive the light source 31 provided by the light source unit 3 to generate the integrated image, and the light source 31 can then pass through the lens array unit 2 (as shown in FIG. 4), so that the light of the integrated image can be reconstructed into a stereo image.

Further, the flat panel display unit 1 is used to display a pattern produced by the integral photography technology, and the flat panel display unit 1 further includes an arithmetic element used to execute algorithms (not shown in the drawings). In addition, the integrated image displayed on the display surface 11 of the flat panel display unit 1 is generated by calculating and re-rendering a flat image, but the present disclosure is not limited thereto.

In some embodiments of the present disclosure, the display surface 11 of the flat panel display unit 1 may be, for example, display pixels of an active flat panel display. For example, the display surface 11 of the flat panel display unit 1 may be display pixels of a smart phone, display pixels of a tablet computer, or display pixels of a flat screen and so on. The present disclosure does not limit the type and structure of the flat panel display unit 1. The feature of the flat panel display unit 1 is to control the switching of stereo images to achieve the effect of dynamic picture display.

In some embodiments of the present disclosure, the display surface 11 of the flat panel display unit 1 may also be, for example, a flat pattern of a passive flat panel display, and the passive flat panel display can only display a static pattern that cannot be freely changed. For example, the flat panel display unit 1 may be, for example, a light box drawing device, a photomask engraving device, a printing drawing device and so on, which can only display a static pattern.

Furthermore, a light field can be controlled by the lens array unit 2. The lens array unit 2 includes a plurality of condenser lenses 21, and the plurality of condenser lenses 21 are configured to control a light angle of the stereo image, thereby enabling a user to view the stereo image from different viewing angles. Accordingly, the user can perceive a depth of the stereo image.

In some embodiments of the present disclosure, each of the condenser lenses 21 is made of a material with good optical characteristics. For example, the material of the condenser lens 21 is selected from a group consisting of glass, poly (methyl methacrylate) (PMMA), polycarbonate (PC), and polyethylene (PE), but the present disclosure is not limited thereto. It should be noted that any material of the condenser lens 21 that has a light transmittance and a degree of softness and hardness suitable for forming a lens falls under the spirit and scope of the present disclosure.

In some embodiments of the present disclosure, the type of the condenser lens 21 may be a lens with light condensing ability or light focusing ability, such as a spherical lens, an aspheric lens, a lens group, a biconvex lens, a plano-convex lens, a meniscus lens, or a Fresnel lens.

In some embodiments of the present disclosure, the plurality of condenser lenses 21 are disposed on a side of the display surface 11 of the flat panel display unit 1. In addition, the plurality of condenser lenses 21 are configured in a matrix arrangement, a staggered arrangement, or an irregular arrangement, and the present disclosure is not limited thereto.

More specifically, the spacer unit 4 may be a single light-transmitting layer that is disposed between the flat panel display unit 1 and the lens array unit 2. The spacer unit 4 may also be a plurality of light-transmitting layers that are stacked upon each other and disposed between the flat panel display unit 1 and the lens array unit 2. The spacer unit 4 is configured to separate and support the flat panel display unit 1 and the lens array unit 2, and the spacer unit 4 is configured to provide for light to pass there-through.

It is worth mentioning that the above-mentioned light-transmitting layer may be, for example, a light-transmitting layer with a solid medium, such as OCA glue or glass, but the present disclosure is not limited thereto. The light-transmitting layer 31 may also be, for example, a light-transmitting layer with a gaseous medium, such as air or other types of gas; or the light-transmitting layer 31 may also be, for example, a light-transmitting layer with a liquid medium, but the present disclosure is not limited thereto.

In order to enable the stereoscopic image display device 100 to be used to reduce the grid visual effect of the stereo image, the light source 31 provided by the light source unit 3 according to the embodiment of the present disclosure satisfies an optical characteristic as follows: an attenuation amplitude of a luminance of the light source 31 before entering the lens array unit 2 being not greater than a predetermined range within a divergence angle of a light field system of the stereoscopic image display device 100, thereby reducing the grid visual effect of the stereo image generated by the stereoscopic image display device.

Figure 5:
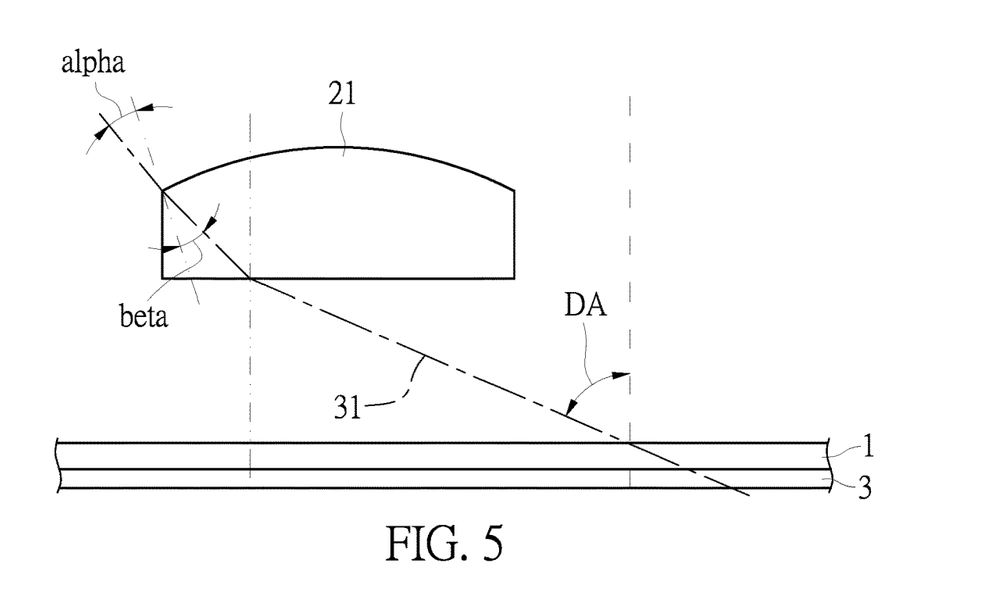
FIG. 5 is a partial enlarged view of FIG. 4.

More specifically, as shown in FIG. 2 to FIG. 5, the divergence angle of the light field system is defined by a formula of:

$$\sin^{-1}(n\_Lens*\sin(90-alpha-beta)).$$

The parameters in the formula are explained as follows:

$$alpha = \tan^{-1}((R - Lens_{seq})/(P/2));$$

$$beta = \sin^{-1}\left(\frac{\sin(90 - alpha - \tan^{-1}(R_{slope}))}{n_{Lens}}\right);$$

$$Lens_{seq} = R - \sqrt{R^2 - (P/2)^2}; \text{ and}$$

$$R\_slope = \frac{\sqrt{\left(\frac{L}{2} + WD*\tan\left(\frac{VA}{2}\right)\right)^2 + \left(\frac{W}{2}\right)^2}}{WD};$$

in which n_Lens is a refractive index of a lens in the lens array unit; R is a radius of curvature of the lens in the lens array unit; P is a distance between two adjacent lenses in the lens array unit; L is a length of the flat display unit; W is a width of the flat display unit; WD is a working distance of the light field system; and VA is a viewing angle of a viewer. That is, the divergence angle is a function of the lens parameter, the size parameter of the flat panel display unit, and the viewing angle of the viewer, but the present disclosure is not limited thereto.

In the above formula, alpha is an angle of the light source after being emitted from an edge of the lens of the lens array unit; beta is an angle of the light source before being emitted from the edge of the lens of the lens array unit; $Lens_{seq}$ is a height of a convex surface of the lens of the lens array unit; and R_slope is a slope defined by a sight of the viewer relative to a corner of the flat display unit.

In a preferred embodiment of the present disclosure, the attenuation amplitude of the luminance of the light source 31 before entering the lens array unit 2 is not greater than 65% within the divergence angle of the light field system of the stereoscopic image display device 100. In a particularly preferred embodiment of the present disclosure, the attenuation amplitude of the luminance of the light source 31 before entering the lens array unit 2 is not greater than 50% within the divergence angle of the light field system of the stereoscopic image display device 100.

In some embodiments of the present disclosure, the divergence angle of the light field system is preferably between 45 degrees and 90 degrees, and more preferably between 60 degrees and 90 degrees. For example, the divergence angle of the light field system is 45 degrees, 50 degrees, 55 degrees, 60 degrees, 65 degrees, 70 degrees, 75 degrees, 80 degrees, 85 degrees, or 90 degrees. The divergence angle varies according to the lens parameters of the lens array unit, the size parameters of the flat panel display unit, and the viewing angle of the viewer.

According to the above configuration, the stereoscopic image display device 100 according to the embodiment of the present disclosure enables the light intensity of the light source passing through the center of the lens and the light intensity of the light source passing through the edge of the lens to become smoother by virtue of the special design of the light source. In other words, the light waveform of the light source 31 (i.e., the light waveform 311 to 313 shown in FIG. 7) has perfect light source divergence characteristics or a wide full width at half maximum (FWHM). Accordingly, the stereoscopic image display device 100 according to the embodiment of the present disclosure can be used to display a stereo image with a low grid visual effect or display a stereo image without the grid visual effect.

The definition of "attenuation amplitude of luminance" mentioned in the present disclosure can be drawn from the following description. A maximum luminance of the light source 31 within the divergence angle is defined as a first luminance (i.e., the luminance of the light source at 0 degrees). A minimum luminance of the light source 31 within the divergence angle is defined as a second luminance (i.e., the luminance of the light source at the divergence angle). The attenuation amplitude of the luminance is a calculated value obtained by subtracting the first luminance from the second luminance, and then dividing by the first luminance, and the unit of the calculated value is expressed by %. That is, the attenuation amplitude of the luminance is defined by the attenuation amplitude of the maximum luminance to the minimum luminance.

Figure 7:
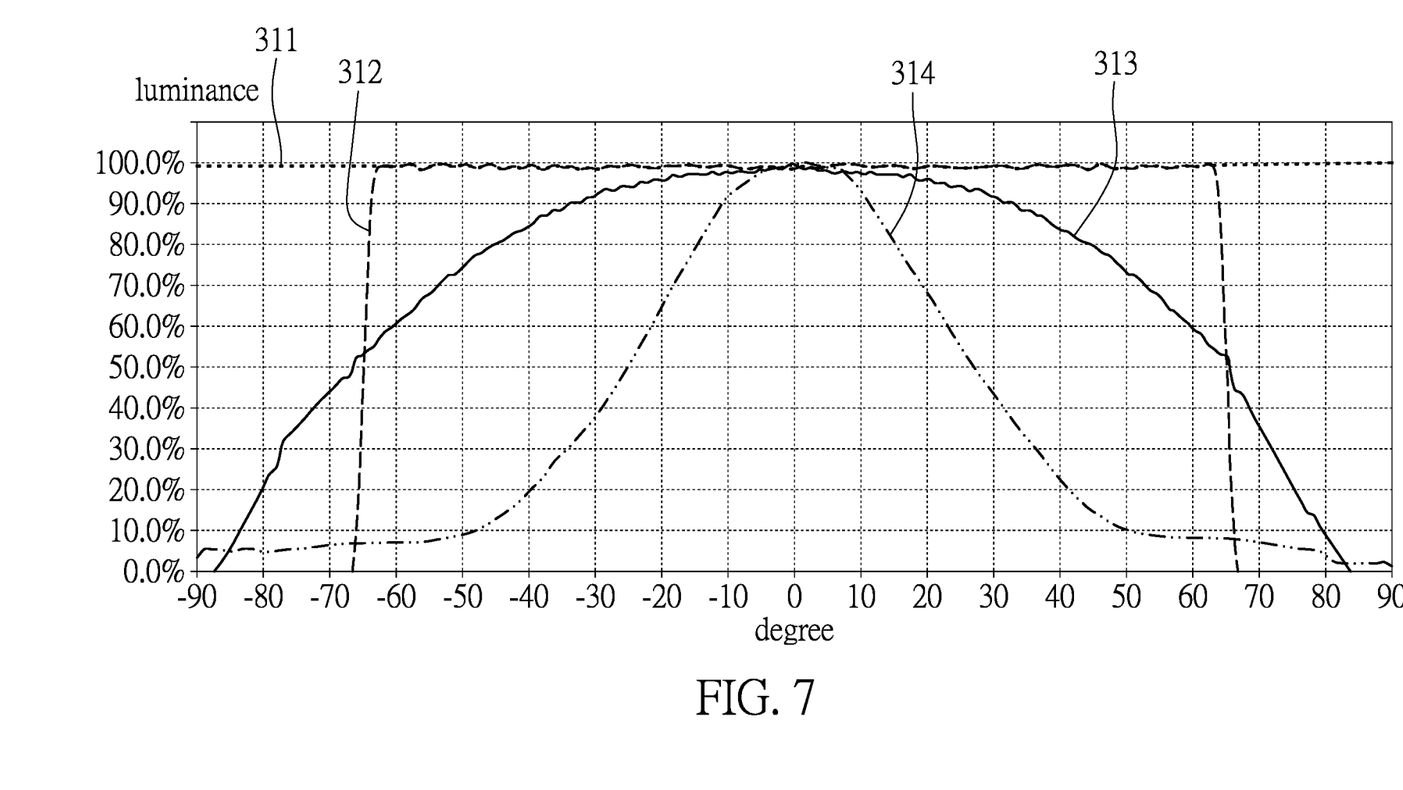
FIG. 7 is a schematic view showing light waveforms of light sources according to the embodiment of the present disclosure.

As shown in FIG. 7, first to fourth light waveforms 311 to 314 of four different light sources 31 are described as follows. It should be noted that FIG. 7 shows a case where the light field system of the stereoscopic image display device 100 has a 65-degree divergence angle after calculation. The following describes the influences of the four different light sources 31 respectively with the first to fourth light waveforms 311 to 314 on the effects of displaying stereo images (i.e., the grid visual effect) of the light field system with the 65-degree divergence angle.

The first light waveform 311 corresponds to a 90-degree perfect divergent light source in an embodiment of the present disclosure. The attenuation amplitude of the luminance of the light source with the first light waveform 311 within 90 degrees is close to zero (e.g., the attenuation amplitude is not greater than 50%). In other words, the attenuation amplitude of the luminance of the light source with the first light waveform 311 within the divergence angle of 65 degrees approaches zero. The divergent light source with the first light waveform 311 enables the stereoscopic image display device 100 to display a stereo image substantially without the grid visual effect.

The second light waveform 312 corresponds to a 65-degree perfect divergent light source in another embodiment of the present disclosure. The attenuation amplitude of the luminance of the light source with the second light waveform 312 within the 65-degree divergence angle approaches zero (e.g., the attenuation amplitude is not greater than 50%), but the attenuation amplitude of the luminance outside the 65-degree divergence angle is significantly reduced (e.g., the attenuation amplitude is at least greater than 90%). The divergent light source with the second light waveform 312 enables the stereoscopic image display device 100 to display a stereo image substantially without the grid visual effect. Furthermore, for the light field system with the 65-degree divergence angle, the image quality of the stereo image produced by the divergent light source with the second light waveform 312 is the same as the image quality of the stereo image produced by the divergent light source with the first light waveform 311.

The third light waveform 313 corresponds to a divergent light source with a luminance greater than 50% of a maximum luminance within the 65-degree divergence angle in yet another embodiment of the present disclosure (e.g., the attenuation amplitude is not greater than 50%). The light waveform of the light source has a wide full width at half maximum (e.g., the light waveform has the shape of a semi-circle or a semi-ellipse). The divergent light source with the third light waveform 313 enables the stereoscopic image display device 100 to display a stereo image having only a slight grid visual effect that cannot be easily perceived by the human eye.

The fourth light waveform 314 corresponds to a divergent light source with a luminance not greater than 50% of a maximum luminance within 65-degree divergence angle in a conventional art (e.g., the attenuation amplitude is greater than 50%). The light waveform of the light source has a narrow full width at half maximum. The divergent light source with the luminance not greater than 50% within 65-degree divergence angle makes a stereo image displayed by the stereoscopic image display device have a grid visual effect with light and dark contrast as shown in FIG. 1, which results in poor image quality.

In general, the light source with the first light waveform 311 and the light source with the second light waveform 312 enable the stereoscopic image display device to display a stereo image substantially without the grid visual effect. Furthermore, the light source with the third light waveform 313 enables the stereoscopic image display device to display a stereo image with only a slight grid visual effect.

In some embodiments of the present disclosure, the divergence angle DA of the light field system is positively correlated with an absolute value of a viewing angle VA of a viewer. That is, if the absolute value of the viewing angle is higher, the divergence angle is also higher.

For example, taking different viewing angles corresponding to different divergence angles as an example for illustration, in a light field system with a flat display unit of 5.5 inches and a working distance of 150 cm, if the viewing angle is between 30 degrees and 40 degrees, the divergence angle is approximately between 65 degrees and 70 degrees; and if the viewing angle is between 10 degrees and 20 degrees, the divergence angle is approximately between 40 degrees and 45 degrees.

In some embodiments of the present disclosure, the divergence angle DA of the light field system is positively correlated with the length L and the width W of the flat display unit 1. That is, if the size of the flat display unit is larger, the divergence angle is also larger.

For example, taking different flat display unit sizes corresponding to different divergence angles as an example for illustration, in a light field system with a viewing angle of between 30 degrees and 40 degrees and a working distance of 150 cm, if the flat display unit is 5.5 inches, the divergence angle is approximately between 65 degrees and 70 degrees; and if the flat display unit is 2.89 inches, the divergence angle is approximately between 52.5 degrees and 57.5 degrees.

In some embodiments of the present disclosure, the light source unit 3 is a backlight unit with a divergent property, and the light source provided by the backlight unit still satisfies the optical characteristic after passing through the flat display unit 1. In other words, the attenuation amplitude of the luminance of the light source provided by the backlight unit after passing through the flat display unit 1 and before entering the lens array unit 2 is preferably not greater than 65% (more preferably not greater than 50%) within the divergence angle of the light field system of the stereoscopic image display device. For example, the backlight unit with the divergent property may be, for example, the divergent light source with the light waveform 311, 312, or 313 in FIG. 7. Therefore, the light source 31 provided by the light source unit 3 can reduce the grid visual effect of the stereo image.

Figure 9:
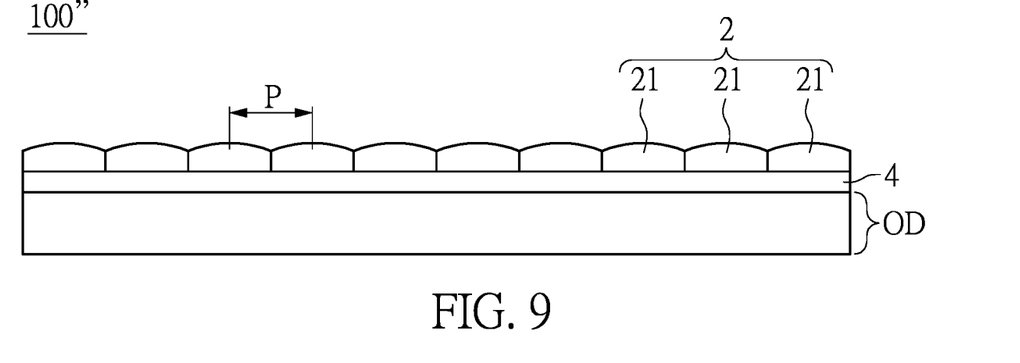
FIG. 9 is a schematic view showing a light source unit that is further defined as a self-luminous light source of an organic light emitting diode display according to one embodiment of the present disclosure.

In some embodiments of the present disclosure, as shown in FIG. 9, the light source unit is further defined as a self-luminous light source of an organic light emitting diode display OD, and the display surface of the flat display unit is further defined as display pixels of the organic light emitting diode display OD. In other words, the light source unit and the flat display unit are components on the same device and are defined by the organic light emitting diode display OD.

Figure 6:
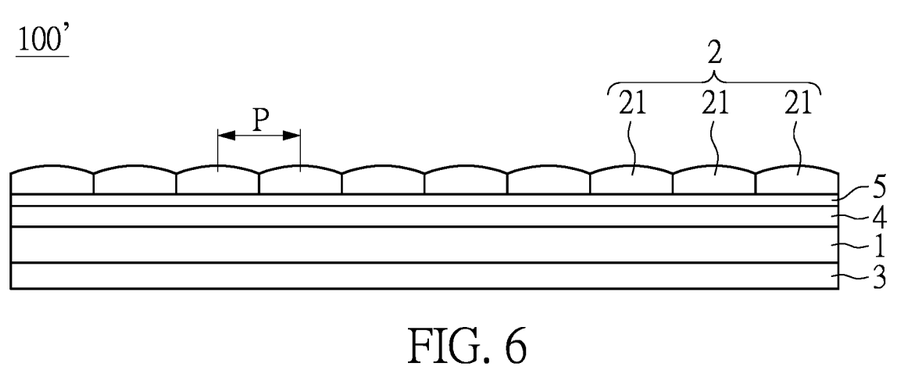
FIG. 6 is a side view showing a stereoscopic image display device including a dielectric coating film according to one embodiment of the present disclosure.

In some embodiments of the present disclosure, as shown in FIG. 6, the stereoscopic image display device 100' further includes: a dielectric coating film 5 that is disposed between the display surface 11 of the flat display unit 1 and the condenser lenses 21 of the lens array unit 2.

A luminance uniformity of the light source 31 is adjusted to meet the optical characteristic after passing through the dielectric coating film 5. The dielectric coating film 5 can be arranged at any position of the spacer unit 4, such as an upper side, a lower side, or an inner side of the spacer unit 4, and the present disclosure is not limited thereto.

Figure 8:
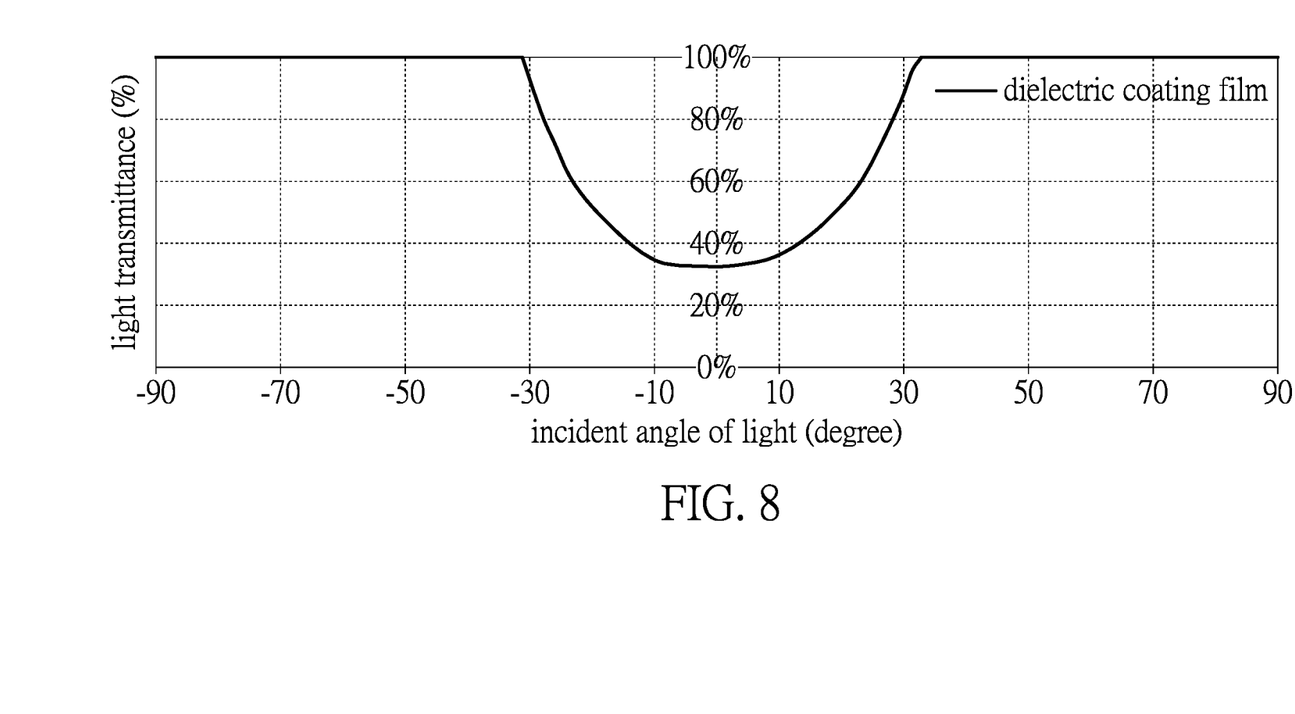
FIG. 8 is a schematic view showing an optical characteristic of the dielectric coating film according to one embodiment of the present disclosure.

Within the divergence angle of the light field system, the dielectric coating film 5 has a first light transmittance with respect to a first incident angle of the light source 31, and the dielectric coating film 5 has a second light transmittance with respect to a second incident angle of the light source. As shown in FIG. 8, the dielectric coating film 5 has the following optical characteristics: if an absolute value of the first incident angle (e.g., −10 degrees to 10 degrees) is less than an absolute value of the second incident angle (e.g., −10 degrees to −20 degrees or 10 degrees to 20 degrees), the first light transmittance (e.g., 30% to 35%) is less than the second light transmittance (e.g., 35 to 50%), but the present disclosure is not limited thereto.

In some embodiments of the present disclosure, the stereoscopic image display device 100 may, for example, simultaneously use the above-mentioned backlight unit with divergent optical characteristics and the dielectric coating film 5 at the same time.

More specifically, the stereoscopic image display device 100 also includes: a backlight unit with divergent optical characteristics and a dielectric coating film 5 disposed between the display surface 11 of the flat display unit 1 and the condenser lenses 21 of the lens array unit 2, so that the light source 31 provided by the light source unit 3 can satisfy the optical characteristic (the attenuation amplitude of the luminance of the light source before entering the lens array unit being not greater than 65% within the divergence angle of the light field system of the stereoscopic image display device) through the above-mentioned backlight unit and the dielectric coating film 5.

Beneficial Effects of the Embodiments

In conclusion, by virtue of "the light source provided by the light source unit satisfies an optical characteristic as follows: an attenuation amplitude of a luminance of the light source before entering the lens array unit being not greater than 65% within a divergence angle of a light field system of the stereoscopic image display device", the stereoscopic image display device of the present disclosure can effectively reduce the grid visual effect of the stereo image, and effectively enhance the display quality of the stereo image.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A stereoscopic image display device capable of reducing grid visual effect, comprising:
   a flat display unit having a display surface, the display surface being configured to display an integrated image;
   a light source unit being disposed on a side of the flat display unit, the light source unit being configured to provide a light source that passes through the flat display unit to provide light required for the display surface to display the integrated image;
   a lens array unit being disposed on another side of the flat display unit; wherein, after the light source provided by the light source unit passes through the flat display unit, the light source is capable of passing through the lens array unit, so that the light of the integrated image is capable of being reconstructed into a stereo image;
   wherein the light source provided by the light source unit satisfies an optical characteristic as follows: an attenuation amplitude of a luminance of the light source before entering the lens array unit being not greater than 65% within a divergence angle of a light field system of the stereoscopic image display device, so as to reduce the grid visual effect of the stereo image generated by the stereoscopic image display device;
   wherein the divergence angle of the light field system is defined by a formula of:

$$\sin^{-1}(N\_Lens * \sin(90 - alpha - beta));$$

wherein, $alpha = \tan^{-1}((R - Lens_{seq})/(P/2));$ wherein, $beta = \sin^{-1}\left(\frac{\sin(90 - alpha - \tan^{-1}(R_{slope}))}{n_{Lens}}\right);$ wherein, $Lens_{seq} = R - \sqrt{R^2 - (P/2)^2};$ -continued $$\text{wherein, R\_slope} = \frac{\sqrt{\left(\frac{L}{2} + WD * \tan\left(\frac{VA}{2}\right)\right)^2 + \left(\frac{W}{2}\right)^2}}{WD}; \text{and}$$

wherein n_Lens is a refractive index of a lens in the lens array unit; R is a radius of curvature of the lens in the lens array unit; P is a distance between two adjacent lenses in the lens array unit; L is a length of the flat display unit; W is a width of the flat display unit; WD is a working distance of the light field system; and VA is a viewing angle of a viewer.

2. The stereoscopic image display device according to claim 1, wherein alpha is an angle of the light source after being emitted from an edge of the lens of the lens array unit; beta is an angle of the light source before being emitted from the edge of the lens of the lens array unit; $Lens_{seq}$ is a height of a convex surface of the lens of the lens array unit; and R_slope is a slope defined by a line of sight of the viewer relative to a corner of the flat display unit.

3. The stereoscopic image display device according to claim 1, wherein the attenuation amplitude of the luminance of the light source provided by the light source unit before entering the lens array unit is not greater than 50% within the divergence angle of the light field system of the stereoscopic image display device.

4. The stereoscopic image display device according to claim 1, wherein the divergence angle of the light field system is positively correlated with an absolute value of the viewing angle of the viewer.

5. The stereoscopic image display device according to claim 1, wherein the divergence angle of the light field system is positively correlated with the length and the width of the flat display unit.

6. The stereoscopic image display device according to claim 1, wherein the light source unit is a backlight unit with a divergent property, and the light source provided by the backlight unit still satisfies the optical characteristic after passing through the flat display unit.

7. The stereoscopic image display device according to claim 1, further comprising: a dielectric coating film that is disposed between the display surface and the lens array unit; wherein a luminance uniformity of the light source is adjusted to meet the optical characteristic after passing through the dielectric coating film.

8. The stereoscopic image display device according to claim 7, wherein, within the divergence angle of the light field system, the dielectric coating film has a first light transmittance with respect to a first incident angle of the light source, and the dielectric coating film has a second light transmittance with respect to a second incident angle of the light source; wherein, if an absolute value of the first incident angle is less than an absolute value of the second incident angle, the first light transmittance is less than the second light transmittance.

9. The stereoscopic image display device according to claim 1, wherein the light source unit is a backlight unit with a divergent property, and the stereoscopic image display device further includes a dielectric coating film that is disposed between the display surface of the flat display unit and the lens array unit, so that the light source provided by the light source unit satisfies the optical characteristic.

10. The stereoscopic image display device according to claim 1, wherein the light source unit is further defined as a self-luminous light source of an organic light emitting diode display (OLED display), and the display surface of the flat display unit is further defined as display pixels of the organic light emitting diode display.

* * * * *